US011187665B2

(12) United States Patent
Edelmann (10) Patent No.: US 11,187,665 B2
(45) Date of Patent: Nov. 30, 2021

(54) METHOD FOR DETERMINING A CALIBRATION SPECIFICATION, METHOD FOR DETERMINING AN ABSOLUTE HUMIDITY, AND NMR MEASURING DEVICE

(71) Applicant: Robert Bosch GmbH, Stuttgart (DE)

(72) Inventor: Markus Edelmann, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/759,239

(22) PCT Filed: Sep. 14, 2018

(86) PCT No.: PCT/EP2018/074944
§ 371 (c)(1),
(2) Date: Apr. 24, 2020

(87) PCT Pub. No.: WO2019/081124
PCT Pub. Date: May 2, 2019

(65) Prior Publication Data
US 2020/0363351 A1 Nov. 19, 2020

(30) Foreign Application Priority Data
Oct. 27, 2017 (DE) ...................... 10 2017 219 378.6

(51) Int. Cl.
*G01N 24/08* (2006.01)
*G01R 33/00* (2006.01)
*G01R 33/44* (2006.01)

(52) U.S. Cl.
CPC ....... *G01N 24/081* (2013.01); *G01R 33/0035* (2013.01); *G01R 33/448* (2013.01)

(58) Field of Classification Search
CPC .. G01N 24/08; G01N 24/081; G01R 33/0035; G01R 33/3808; G01R 33/448
See application file for complete search history.

(56) References Cited

U.S. PATENT DOCUMENTS 4,701,705 A 10/1987 Rollwitz
2013/0302851 A1* 11/2013 Fraley ................... G01N 21/84
435/40.5

FOREIGN PATENT DOCUMENTS

CN 106124552 A 11/2016
CN 111060546 A * 4/2020
(Continued)

OTHER PUBLICATIONS

International Search Report corresponding to PCT Application No. PCT/EP2018/074944, dated Apr. 18, 2019 (German and English language document) (7 pages).
(Continued)

*Primary Examiner* — Jay Patidar
(74) *Attorney, Agent, or Firm* — Maginot, Moore & Beck LLP (57) ABSTRACT

A method determines a calibration specification specifying a functional correlation between an NMR measurement variable, determined using an NMR measuring device, for a material to be analyzed and a humidity contained in the material to be analyzed. The method includes provision of a relaxation curve of the material having a known humidity; determination of a relaxation time distribution from the relaxation curve provided; and determination of an approximate relaxation time distribution relative to at least one other humidity. The at least one other humidity is less than the known humidity. The method further includes reconstruction of another relaxation curve from the approximate relaxation time distribution; determination of an expected NMR measurement variable from the reconstructed other relax-
(Continued)

ation curve for the at least one other humidity; and determination of the calibration specification as a function of the humidity contained in the material, in accordance with the determinable NMR measurement variable.

9 Claims, 5 Drawing Sheets

(56) References Cited

FOREIGN PATENT DOCUMENTS

| | | | |
|---|---|---|---|
| CN | 111735739 B | * | 12/2020 |
| DE | 299 495 A7 | | 4/1992 |
| DE | 10 2014 218 375 A1 | | 3/2016 |
| WO | 2016/109554 A1 | | 7/2016 |

OTHER PUBLICATIONS

Kratzer et al., "Hydration Dynamics of Durum Wheat Endosperm as Studied by Magnetic Resonance Imaging and Soaking Experiments," Cereal Chemistry, vol. 85, No. 5., Oct. 2008 (7 pages).
Blümich et al., "Small-scale instrumentation for nuclear magnetic resonance of porous media," New Journal of Physics, vol. 13, Jan. 2011 (16 pages).

* cited by examiner

METHOD FOR DETERMINING A CALIBRATION SPECIFICATION, METHOD FOR DETERMINING AN ABSOLUTE HUMIDITY, AND NMR MEASURING DEVICE

This application is a 35 U.S.C. § 371 National Stage Application of PCT/EP2018/074944, filed on Sep. 14, 2018, which claims the benefit of priority to Serial No. DE 10 2017 219 378.6, filed on Oct. 27, 2017 in Germany, the disclosures of which are incorporated herein by reference in their entirety.

BACKGROUND

The reliable determination of material and building humidity represents an important aspect in the modern construction industry. A drying cabinet method (Darr method) is conventionally used as a reference method for humidity determination. However, the drying cabinet method is restricted to laboratory work and is therefore only limitedly usable in the field.

For nondestructive measurement of humidity of a material to be analyzed in situ, methods that are based on dielectric measurements or on nuclear magnetic resonance measurements are currently used in particular. In order to obtain an absolute value of the humidity of a material to be analyzed, however, it is necessary to establish a relationship between a measurement variable which can be determined and the humidity. Usually, a material-specific calibration specification is in this case employed, which is determined by elaborate preliminary measurements, for example during factory calibration. In this case, a sample of the material having defined humidities is successively measured so that such a method for determining a calibration specification typically takes several weeks—in particular also since the humidity of a material can often be adjusted only very slowly.

DE 10 2014 218 375 A1 discloses mobile NMR measuring devices having a sensor apparatus, the sensor apparatus comprising at least one nuclear magnetic resonance sensor (NMR sensor) which is intended to determine a humidity value of a material to be analyzed.

The disclosure relates to a method for determining an in particular material-specific calibration specification for use with such an NMR measuring device, the calibration specification specifying a functional relationship between an NMR measurement variable A, which can be determined using the NMR measuring device, of a material to be analyzed and a humidity θ contained in the material to be analyzed.

SUMMARY

A method is proposed for determining an in particular material-specific calibration specification for use with an NMR measuring device, the calibration specification specifying a functional relationship between an NMR measurement variable A, which can be determined using the NMR measuring device, of a material to be analyzed and a humidity θ contained in the material to be analyzed. The method according to the disclosure is characterized by at least the following method steps: providing a relaxation curve $s(t,\theta_{ref})$ of the material, in particular at least of a material sample of the material, having a known humidity $\theta_{ref}$; determining a relaxation time distribution $\rho(\theta_{ref})$ from the relaxation curve $s(t,\theta_{ref})$ provided; determining, in particular modeling or calculating, an approximated relaxation time distribution $\rho(\theta_i)$ relating to at least one humidity $\theta_i$, with $\theta_i<\theta_{ref}$; reconstructing a relaxation curve $s(t,\theta_i)$ from the approximated relaxation time distribution $\rho(\theta_i)$; determining an expected NMR measurement variable A from the reconstructed relaxation curve $s(t,\theta_i)$ for the humidity $\theta_i$; determining the calibration specification as a function θ(A) describing the humidity θ as a function of the NMR measurement variable A.

In one embodiment of the method, the method steps may be carried out in the order presented. As an alternative, the order of the method steps carried out in the method according to the disclosure may also differ from the order presented above.

The term "determining an in particular material-specific calibration specification" is intended, in particular, to mean the determination of the functional relationship between an NMR measurement variable A, which can be determined, i.e. measured, using the NMR measuring device, of a material to be analyzed and a humidity θ contained in the material to be analyzed. The term "calibration specification" may in this case be intended to mean any form of assignment of the NMR measurement variable A which can be determined using the NMR measuring device to the associated humidity θ causing the corresponding NMR measurement variable. In one embodiment, the material-specific calibration specification may for example be embodied in the form of a calibration curve, a calibration database, a calibration function, a calibration matrix, or the like.

The material is, in particular, given and established by a corresponding sample or a corresponding workpiece of the material. For example, the material may be particular wood, particular concrete, a particular construction material or a particular construction material mix, or the like.

The "NMR measurement variable A" refers in principle to any parameter familiar to a person skilled in the art, a quantity or a value, which may be obtained by using an NMR measuring device, i.e. on the basis of a measurement of nuclear spin physical effects in the material to be analyzed, of the material to be analyzed, or which may be derived from corresponding measurements. A "nuclear spin physical effect" is in this case intended to mean any effect by which, in a first magnetic field denoted by $B_0$, atomic nuclei in the material to be analyzed absorb and emit alternating electromagnetic fields. In this case, the nuclear magnetic resonance is based on the precession (Larmor precession) of nuclear spins of the atomic nuclei in the material to be analyzed around the magnetic field lines of the in particular constant and/or static first magnetic field. In particular, the nuclear spins of the atomic nuclei are aligned by the first magnetic field in a volume to be analyzed. If energy is applied onto the atomic nuclei in the form of a second electromagnetic field, in particular an alternating field, for example a pulsed magnetic field, which is in resonance with the Larmor precession of their nuclear spins (energy quanta), the atomic nuclei may change the orientation of their spins relative to the first magnetic field by absorbing this energy. The applied second magnetic field is therefore used to excite the nuclear spins, which change their nuclear spin states by absorbing energy. Equivalently, the emission of energy quanta as a result of the excited nuclear spins returning into a different, lower energy level leads to the emission of an alternating electromagnetic field which may be observed by means of an apparatus for detecting a magnetic field change, in particular by means of an antenna and/or a coil. The atomic nuclei are intended, in particular, to mean protons (H) and other nuclear magnetic resonance-active nuclei, such as, for example 13C, 15N, 19F, 31P. For example—but not exclusively—the NMR measurement variable A may be a relaxation curve, in particular a transverse relaxation curve or a longitudinal relaxation curve, a part of a relaxation curve, in particular an amplitude or a relaxation time such as a T2 time, or the like. As an alternative, the NMR measurement variable A may also refer to the physical NMR measurement signal, independent of preprocessing (for example a Fourier transform), of the material during an NMR measurement, which is obtained merely as a result of the chemical structure in the material.

The term "humidity $\theta$" is intended, in particular, to mean a concentration of volatile water (to be distinguished from firmly chemically bound water of crystallization or water of hydration) in the material to be analyzed. The humidity $\theta$ is in this case intended to mean an absolute humidity $\theta$, as opposed to a relative humidity, which only specifies the difference from another humidity value.

In one method step of the method according to the disclosure, a relaxation curve $s(t,\theta_{ref})$ of the material, at least of a material sample of the material, having a known humidity $\theta_{ref}$ is provided. The term "provide" is intended below to mean, in particular, that the computation unit which carries out the method according to the disclosure, in particular the control apparatus of an NMR measuring device, is provided with corresponding information or a data set. In one embodiment, the relaxation curve $s(t,\theta_{ref})$ is measured by means of an NMR sensor of an NMR measuring device and provided to the computation unit carrying out the method according to the disclosure, in particular the control apparatus of an NMR measuring device. For example, a relaxation curve of a material may typically be obtained by an NMR measuring device when the nuclear spins contained in the material to be analyzed are aligned in a strong static magnetic field and are energetically excited with a radiofrequency pulse (i.e. the nuclear magnetization is rotated). Subsequently, the radiofrequency response of the material is recorded as a function of time, and the relaxation curve $s(t,\theta_{ref})$ (also known as an FID signal (free induction decay signal)) is obtained in this way. In addition, so-called spin-echo techniques (in particular CPMG pulse sequences) may be used in order to prevent external influences, such as, for example inhomogeneous magnetic fields, on the relaxation.

In one embodiment of the method according to the disclosure, the relaxation curve $s(t,\theta_{ref})$ provided is provided as a transverse relaxation curve, in particular as a T2 relaxation curve. For the transverse relaxation curve, a T2 time distribution is determined, which is attributable to a spin-spin relaxation of the atomic nuclei in the material analyzed. During the spin-spin relaxation, spins of the same type generally exchange energy with one another, so that the "temperature" of the spin system (so-called spin temperature) is homogenized within a characteristic time "T2", a nucleus which returns from an excited state to a ground state imparts its energy to a neighboring nucleus, which is thereby in turn excited. In an alternative embodiment of the method according to the disclosure, the relaxation curve provided is provided as a longitudinal relaxation curve. For the longitudinal relaxation curve, a T1 time distribution is determined, which is attributable to a spin-lattice relaxation of the atomic nuclei in the material analyzed. A plurality of processes may in this case contribute to the spin-lattice relaxation, inter alia magnetic dipole-dipole coupling of the nuclear spins, local magnetic fields due to electron spins of the environment (chemical shift) and quadrupole electric fields (nuclear quadrupole moment). By the local magnetic fields generated by these interactions fluctuating because of the thermal movement of the nuclei (and therefore the variation of their distances), characteristic relaxation processes take place.

In order to obtain a relaxation curve $s(t,\theta_{ref})$ of the material, the material having a known humidity $\theta_{ref}$, the material (i.e. in particular a sample of this material) is adjusted to said humidity $\theta_{ref}$. This adjustment to a humidity $\theta_{ref}$ may, for example, be carried out by using a drying cabinet method in a laboratory. In one embodiment of the method, the known humidity $\theta_{ref}$ is the saturation humidity of the material. In an alternative embodiment of the method, the known humidity $\theta_{ref}$ is at least 50%, in particular at least 70%, very particularly at least 90% of the saturation humidity of the material.

In one embodiment, the relaxation curve $s(t,\theta_{ref})$, measured by means of an NMR measuring device (or provided in another way) at a given humidity $\theta_{ref}$ of the material to be analyzed may be formulated as:

$$s(t, \theta_{ref}) = \int \rho(\tau, \theta_{ref}) \exp\left(-\frac{t}{\tau}\right) d\tau.$$

In this case, the initial amplitude is a direct measure of the spin density and therefore of the humidity in the material, with $s(t=0) \partial \theta_{ref}$. In particular, the relaxation curve represents a superposition of many exponentially decreasing components. The "relaxation time distribution" provides information about the binding strength and mobility freedom of water molecules in the material analyzed. In this case, in particular, long relaxation times are obtained for weakly bound water molecules and for water molecules in large pores of the material. Since a material to be analyzed typically has a pore size distribution, there is likewise a distribution of the relaxation times, which corresponds to said relaxation time distribution. In one embodiment of the method according to the disclosure, the relaxation time distribution $\rho(\theta_{ref})$ is determined by inverse Laplace transformation from the relaxation curve $s(t,\theta_{ref})$ provided.

The term "determining an approximated relaxation time distribution $\rho(\theta_i)$" is intended, in particular, to mean that an approximated relaxation time distribution $\rho(\theta_i)$ relating to at least one humidity $\theta_i$, with $\theta_i < \theta_{ref}$ which approximates an actually measurable relaxation time distribution for the corresponding humidity $\theta_i$, is derived on the basis of the relaxation time distribution $\rho(\theta_{ref})$ which has been determined. The approximated relaxation time distribution $\rho(\theta_i)$ may in this case be modeled or calculated on the basis of the relaxation time distribution $\rho(\theta_{ref})$ which has been determined, or determined directly from the relaxation time distribution $\rho(\theta_{ref})$ which has been determined by modifying or converting this relaxation time distribution $\rho(\theta_{ref})$ which has been determined. In one embodiment, the approximated relaxation time distribution $\rho(\theta_i)$ relating to at least one humidity $\theta_i$, with $\theta_i < \theta_{ref}$ is calculated by multiplying the relaxation time distribution $\rho(\theta_{ref})$ by a Heaviside step function $H(\tau_c(\theta_i) - \tau)$, where $\tau_c(\theta_i)$ is selected in such a way that the integral $s(\theta_i) = \int \rho(\tau,\theta_i) d\tau$ is less by a fraction $1 - \theta_i/\theta_{ref}$ than the same integral for the humidity $\theta_{ref}$, i.e. than $s(\theta_{ref}) = \int \rho(\tau,\theta_{ref}) d\tau$.

In other words, $\tau_c(\theta_i)$ is selected in such a way that the ratio of the integrals $s(\theta_i)/s(\theta_{ref})$ corresponds to the ratio $\theta_i/\theta_{ref}$. In this "approximation model", the relaxation time distribution ρ(θ$_i$) is reduced in such a way that successive large relaxation times are removed from the integral (set to zero).

The "reconstruction of an approximated relaxation curve s(t,θ$_i$)" from the approximated relaxation time distribution ρ(θ$_i$) may, in particular, be carried out by calculating the integral $$s(t, \theta_i) = \int \rho(\tau, \theta_i) \exp\left(-\frac{t}{\tau}\right) d\tau.$$

With the reconstructed relaxation curve s(t,θ$_i$) for the humidity θ$_i$, it is subsequently possible to determine an expected NMR measurement variable A, in particular an expected value of an NMR measurement variable. As already discussed, the NMR measurement variable A may in this case, in principle, represent any parameter, familiar to a person skilled in the art, which may be obtained by using an NMR measuring device, i.e. on the basis of a measurement of nuclear spin physical effects in the material to be analyzed, of the material to be analyzed, or which may be derived from corresponding measurements. In one exemplary embodiment, the expected NMR measurement variable A is a relaxation curve or an amplitude value s(0,θ$_i$) of the transverse relaxation curve or an average over a particular time interval, or the like.

Said expected NMR measurement variable A as well as the absolute humidity θ—or alternatively also a value characterizing the humidity θ (characteristic humidity value)—is then defined in the calibration specification as a function θ(A) describing the humidity θ as a function of the NMR measurement variable A which can be determined. It is clear that, with an increasing number of approximated relaxation time distributions ρ(θ$_i$) determined for different humidities θ and expected NMR measurement variables A obtained therefrom, an accuracy of the calibration specification may be increased. In one embodiment of the method according to the disclosure, in a further method step, approximated relaxation time distributions ρ(θ$_i$) relating to a multiplicity i of humidities θ$_i$, with θ$_i$<θ$_{ref}$, are calculated, for example relating to more than 3, in particular relating to more than 5, very particularly relating to more than 10 humidities θ$_i$, with θ$_i$<θ$_{ref}$. The humidities θ and associated expected NMR measurement variables A obtained in this way are used to define or compile the calibration specification.

It should be mentioned that, in one embodiment of the method, the relaxation curve(s) may be preprocessed by known methods of data evaluation before further processing, for example in order to obtain an improved signal-to-noise ratio. It is furthermore possible to reduce or eliminate irregularities in the relaxation curve by a method carried out automatically. Another type of data processing may also be carried out in the scope of the method, for example in the scope of background correction, smoothing, filtering, averaging, or the like.

By using the method according to the disclosure, the determination of a material-specific calibration specification may be accelerated significantly (for some materials of the order of weeks (prior art) to a few hours). In contrast to previous methods for determining a calibration specification, such as are known from the prior art, in the scope of the proposed method only a single calibration measurement is required, which is carried out for the preferably high humidity θ$_{ref}$. The method is based, in particular, on discoveries about the drying behavior of porous materials. Furthermore, in this way the compilation of a database, which contains material-specific calibration specifications for different materials, may be carried out in a relatively short time. In order to permit reliable determination of a humidity θ of a material to be analyzed for a large range of materials, it is now possible to determine the underlying database in the form of calibration specifications for the various materials in an acceptable time.

In one embodiment of the method, the method is intended to be carried out by an NMR measuring device, or by using an NMR measuring device. A corresponding NMR measuring device, in particular a mobile, preferably handheld NMR measuring device, to this end comprises at least an NMR sensor (the terms "nuclear magnetic resonance sensor" and "NMR sensor" are used synonymously in this document) and a control apparatus for controlling the NMR measuring device and for evaluating an NMR measurement signal delivered by the nuclear magnetic resonance sensor. Correspondingly, the NMR measuring device, in particular its control apparatus, is intended and adapted for carrying out the method according to the disclosure for determining a material-specific calibration specification.

The term "intended" is intended in particular to mean specially "programmed", "configured" and/or "equipped". That an object is "intended" for a particular function is, in particular, intended to mean that the object fulfills and/or carries out this particular function in at least one application state and/or operating state, or is configured to fulfill the function.

A method is furthermore proposed for determining an absolute humidity θ of a material to be analyzed, by using an NMR measuring device, in particular a method for calibrating a humidity measurement relating to a determination of an absolute humidity θ of a material to be analyzed. The method comprises at least the method steps: specifying a material to be analyzed, in particular by using an input apparatus of the NMR measuring device; recording an NMR measurement variable A of the material to be analyzed, by means of the NMR measuring device; providing an in particular material-specific calibration specification as a function of the specified material, in particular a calibration specification determined by the method according to the disclosure for determining a calibration specification; determining the absolute humidity θ by using the functional relationship, specified in the calibration specification, between the recorded NMR measurement variable A of the material to be analyzed and the humidity θ contained in the material analyzed.

In one embodiment of the method, it is intended to be carried out by an NMR measuring device, or by using an NMR measuring device. A corresponding NMR measuring device, in particular a mobile, preferably handheld NMR measuring device, to this end comprises at least an NMR sensor (the terms "nuclear magnetic resonance sensor" and "NMR sensor" are used synonymously in this document), a control apparatus for controlling the NMR measuring device and for evaluating an NMR measurement signal delivered by the nuclear magnetic resonance sensor, and an input apparatus for input of information, in particular for specifying a material to be analyzed. The NMR measuring device, in particular its control apparatus, is furthermore intended and adapted for carrying out the method according to the disclosure for determining an absolute humidity θ.

It should be mentioned at this point that the NMR measuring device for carrying out the method according to the disclosure for determining a material-specific calibration specification may—but does not have to be—the same as the NMR measuring device for carrying out the method according to the disclosure for determining an absolute humidity θ of a material to be analyzed. Particularly in the latter case, the method for determining a material-specific calibration specification may also be carried out on a computer by using an NMR measuring device (for example by using a so-called "NMR MOUSE" ("Mobile Universal Surface Explorer")) or on a laboratory NMR measuring device, which can be carried out absolutely independently of an NMR measuring device for carrying out the method according to the disclosure for determining an absolute humidity θ of a material to be analyzed.

The term "specifying a material to be analyzed" is intended, in particular, to mean that information about the type or the composition of the material to be analyzed is provided to the control apparatus, which carries out the method according to the disclosure for determining an absolute humidity θ, of the NMR measuring device. By the specifying of the material to be analyzed, the material to be analyzed may be selected case-specifically by a user of the method according to the disclosure according to their present measurement requirement. In particular, the material to be analyzed may be specified as a result of an input or selection by a user, for example by means of an input apparatus or by means of a menu selection or by means of a barcode scanner, or the like. As an alternative, this information may also be provided to the control apparatus in a different way, for example by reading from a memory. In one embodiment, the information about the at least one material to be analyzed may be static information (permanently specified), i.e. in the method according to the disclosure analysis is always carried out in relation to the same material. By specifying the material to be analyzed, information processing, in particular the evaluation, may advantageously be adapted to the material to be analyzed, in that the corresponding material-specific calibration specification may be selected as a function of the specifying. Furthermore, particularly in connection with the specification, an operating program of the control apparatus, regulation routines, control routines, evaluation routines and/or calculation routines may be adapted.

The NMR measurement variable A to be recorded in the method according to the disclosure for determining an absolute humidity θ corresponds to that NMR measurement variable A which is used in the method according to the disclosure for determining a calibration specification in order to determine the calibration specification as a function θ(A) describing the humidity θ as a function of the NMR measurement variable A which can be determined. In accordance with the example already mentioned, it may in this case likewise be a relaxation curve, in particular a transverse relaxation curve, a part of a relaxation curve, in particular an amplitude or a relaxation time such as a T2 time, or the like. As an alternative, the NMR measurement variable A may also refer to the physical signal, independent of preprocessing (for example a Fourier transform), of the material during an NMR measurement, which is obtained merely as a result of the chemical structure in the material. The NMR measurement variable A to be recorded is determined by means of the NMR measuring device, i.e. recorded by using the NMR sensor and optionally analyzed by means of the control apparatus.

The providing of the in particular material-specific calibration specification is carried out as a function of the material specified. In this way, an NMR measurement may be adapted to the material analyzed, and particularly accurate quantification of the humidity θ contained in the material may therefore be determined. In this case, the material-specific calibration specification may be transmitted to the NMR measuring device either by reading from a memory internal to the device and/or by transmitting the calibration specification from a device external to the device, for example a server, a portable data processing device or the like, by using a data communication interface.

Finally, by using the calibration specification provided, the absolute humidity θ may be determined by using the functional relationship, specified in the calibration specification, between the recorded NMR measurement variable A and the humidity θ to be expected, according to the calibration specification, in the material analyzed. To this end, it is merely necessary to determine the humidity θ associated, i.e. stored according to the calibration specification or calculable, with a particular NMR measurement variable A.

In one embodiment of the method according to the disclosure for determining an absolute humidity θ, the absolute humidity θ which has been determined for the material analyzed is output by using an output apparatus of the NMR measuring device. The evaluated humidity θ may be provided by the control apparatus for further processing and/or output, in particular for output to a user of the NMR measuring device, by means of an output apparatus and/or for output to an external device by means of a data communication interface.

An NMR measuring device according to the disclosure is furthermore proposed, in particular a handheld NMR measuring device, having at least an NMR sensor and a control apparatus for controlling the NMR measuring device and for evaluating an NMR measurement signal delivered by the NMR sensor. The control apparatus of the NMR measuring device is intended and specially adapted for carrying out the method according to the disclosure for determining a material-specific calibration specification and/or for carrying out the method according to the disclosure for determining an absolute humidity θ of a material to be analyzed.

Here, the term "handheld NMR measuring device" is intended in particular to mean that the NMR measuring device can be transported, and in particular also guided during a measurement process onto and/or along a measurement sample to be analyzed, without the aid of a transport machine merely with the hands, in particular with one hand. To this end, the mass of the handheld measuring device is in particular less than 20 kg, advantageously less than 10 kg and particularly advantageously less than 2 kg.

In one embodiment of a handheld NMR measuring device, the component parts of the NMR measuring device, in particular the NMR sensor, the control apparatus and the energy supply apparatus of the NMR measuring device, are at least partially accommodated in a housing of the NMR measuring device. In particular, more than 50%, preferably more than 75% and particularly preferably 100% of the total volume of the component parts is accommodated in the housing of the NMR measuring device.

In one embodiment, the NMR measuring device is produced as an energy-autonomous NMR measuring device. The term "energy-autonomous" is intended to mean that the NMR measuring device can be operated at least temporarily, preferably at least while carrying out a measurement and during evaluation, independently of an electrical supply network, i.e. in particular without a cable. To this end, the NMR measuring device comprises an energy supply apparatus in the form of an energy storage unit independent of an electrical supply network, particularly in the form of a battery, preferably in the form of a rechargeable battery. The energy supply apparatus is intended for supplying the NMR measuring device with electrical energy for start-up and during operation. The energy storage unit independent of an electrical supply network may in one embodiment be produced as a fuel cell, a capacitor, a hybrid supercapacitor, or as another type of energy storage unit which seems expedient to the person skilled in the art, or a combination/plurality thereof. In particular, accumulators with a cell chemistry that provides a high power density and/or energy density are suitable for the energy supply of the NMR measuring device. A high power density and/or energy density allows an improved, i.e. longer-lasting energy supply, adapted to a high power requirement of the NMR sensor, of the NMR measuring device. These currently include, for example, accumulators with the lithium or lithium-ion cell chemistry, in particular lithium iron phosphate, lithium manganese oxide, lithium nickel cobalt manganese oxide, superlithiated lithium nickel cobalt manganese oxide, lithium-sulfur, lithium-polymer and lithium-oxygen accumulators.

The NMR measuring device according to the disclosure comprises a control apparatus for controlling it. The control apparatus is connected in signal technology to the other component parts of the NMR measuring device, in particular the NMR sensor, in particular an output apparatus, the energy supply apparatus, furthermore for example an input apparatus and/or a data communication interface. The control apparatus is intended to communicate with these component parts during operation of the NMR measuring device. The term "control apparatus" is intended, in particular, to mean an apparatus having at least one set of control electronics, which comprises means for communication with the other component parts of the NMR measuring device, for example means for controlling and/or regulating the NMR sensor, data processing means, data memory means and/or further means which seem expedient to the person skilled in the art. In one embodiment, the control electronics of the control apparatus are intended to mean a processor unit in combination with a memory unit as well as with an operating program stored in the memory unit, which is executed during the control process. In particular, the electronic components of the control apparatus may be arranged on a circuit board (printed circuit board), for example in the form of a microcontroller. The control apparatus is furthermore used to evaluate at least one NMR measurement signal delivered by the NMR sensor, in particular to evaluate and provide a relaxation curve $s(t,\theta_{ref})$ of the material, to determine a relaxation time distribution $\rho(\theta_{ref})$ from the relaxation curve $s(t,\theta_{ref})$ provided, to determine an approximated relaxation time distribution $\rho(\theta_i)$, in particular on the basis of and by using the relaxation curve $s(t,\theta_{ref})$ provided, to reconstruct a relaxation curve $s(t,\theta_i)$ from the approximated relaxation time distribution $\rho(\theta_i)$, to determine an expected NMR measurement variable A from a reconstructed relaxation curve $s(t,\theta_i)$, and to determine a calibration specification as a function $\theta(A)$ describing the humidity $\theta$ as a function of the NMR measurement variable A which can be determined. As an alternative or in addition, the control apparatus is used to evaluate at least one NMR measurement signal delivered by the NMR sensor, in particular to record an NMR measurement variable A of the material to be analyzed, to provide a calibration specification as a function of a specified material, and to determine the absolute humidity $\theta$ by using the functional relationship specified in the calibration specification. The term "intended to evaluate" means, in particular, that the control apparatus comprises an information input for receiving the NMR measurement signals, an information processing unit for processing, in particular evaluating the NMR measurement signals, and an information output for forwarding the processed and/or evaluated NMR measurement signals, in particular relaxation curves, relaxation time distributions or in general NMR measurement variables A determined from the NMR measurement signals, and/or evaluation results obtained. In one embodiment, to this end the control apparatus comprises component parts that include at least a processor, a memory and an operating program having evaluation and calculation routines. In particular, these component parts may also be referred to as an evaluation apparatus and/or they may be configured as an evaluation apparatus separate from the control apparatus.

In one embodiment of the NMR measuring device, the NMR measuring device comprises an output apparatus for output of determined information. The term "output apparatus" of the NMR measuring device is intended to mean at least one means which is intended to output at least one varying information item acoustically, optically and/or in a tactile fashion to a user. The output apparatus is used to output to the user of the NMR measuring device at least that information which is obtained by using the NMR measuring device. In particular, a result of the quantification of the humidity $\theta$ may be output by means of the output apparatus. The output may in this case, for example, be carried out by means of a display screen, a touch-sensitive display screen, an acoustic signal, a vibration generator and/or an LED display. In one embodiment of the output apparatus, the information may be output graphically or alphanumerically as a measurement result of the analysis. In one embodiment, the output apparatus is accommodated in the housing of the handheld NMR measuring device. Furthermore, information or results to be output may also be output to the control apparatus and/or, particularly in order to increase user convenience, to a data-processing system. The latter comprises at least one output of information to an external devices such as a smartphone, a tablet PC, a PC or another external data device which appears expedient to a person skilled in the art, connected to the NMR measuring device by means of a data communication interface. In particular, the output apparatus may be accommodated directly in the housing of the NMR measuring device, and may in addition also be supplemented by means of external output apparatuses. By using the information output by means of the output apparatus to a user of the NMR measuring device, it is made possible for the user of the NMR measuring device to obtain an intuitively comprehensible result after carrying out quantification of the analyte in the measurement sample.

In order to carry out measurements, particularly in order to measure an NMR measurement signal, particularly in order to record a relaxation curve or in general to record an NMR measurement variable A, the NMR measuring device comprises at least one NMR sensor. The functionality of the NMR sensor is based on the already described "nuclear spin physical" effect. The NMR measuring device according to the disclosure makes it possible to determine information from the NMR measurement signals obtained by the at least one NMR sensor, and therefore to draw conclusions which relate to the humidity $\theta$, in particular the concentration of water, and consequently the state of a material to be analyzed. In order to carry out the measurement, the mobile NMR measuring device, in particular the at least one NMR sensor, is brought close to the measurement sample to be analyzed, or vice versa. The use of the measuring device in this case makes it possible to analyze the measurement sample without impairment, in particular without destruction, contamination or the like.

The energy-autonomous mobile NMR measuring device represents a specialized measuring device which, in comparison with scientific nuclear magnetic resonance measuring devices, has a very restricted functionality optimized for the analysis of a measurement sample, i.e. of a material to be analyzed. In particular, the control apparatus with its evaluation routines is tailored to carrying out the method according to the disclosure for determining an in particular material-specific calibration specification, and/or to carrying out the method according to the disclosure for determining an absolute humidity θ. Furthermore, the NMR measuring device may be tailored to evaluating the information obtained and for its preprocessed representation and output by means of an output apparatus. When the measuring device is used to analyze a material to be analyzed, the measurement results are preprocessed for the user of the NMR measuring device inside the device and immediately following the measurement, so that rapid and clear quantification, above all independent of further devices such as computers or even laboratories, of the humidity θ in the material to be analyzed is possible in situ. Advantageously, simple and intuitive operation of the measuring device may be achieved, which does not require any particular prior experience of the user.

By using the handheld energy-autonomous measuring device, specially tailored to the application of analyzing a measurement sample, it is possible rapidly and nondestructively, and therefore economically particularly inexpensively, to carry out precise and comprehensive quantification of a humidity θ in a material to be analyzed, particularly in a measurement sample or a workpiece, in a mobile fashion in situ, for example on a building site or the like.

Particularly advantageously, the mobile measuring device makes it possible to determine the humidity θ in a workpiece without destruction of the workpiece. In particular, the measurement method is a nondestructive, in particular contactless measurement method, i.e. in one embodiment of the measuring device according to the disclosure the humidity θ may even be obtained without any contact of the measuring device with the sample to be measured, if applicable even without contact with the workpiece to be analyzed. The positioning of the measuring device, in particular of the nuclear magnetic resonance sensor contained therein, in the immediate vicinity of the workpiece surface makes it possible to determine humidity values as far as a material depth of a few centimeters into the workpiece.

BRIEF DESCRIPTION OF THE DRAWINGS

The disclosure is explained in more detail in the description below with the aid of exemplary embodiments represented in the drawings. The drawings, the description and the claims contain numerous features in combination. The person skilled in the art will expediently also consider the features individually and combine them to form other useful combinations. Reference signs which are the same or similar in the figures denote elements which are the same or similar.

In the drawings:

FIG. 4a shows an exemplary relaxation curve $s(t,\theta_{ref})$ for the humidity $\theta_{ref}$, FIG. 4b shows a relaxation time distribution $\rho(\theta_{ref})$ calculated for the relaxation curve $s(t,\theta_{ref})$ represented in FIG. 4a, FIGS. 4c,d respectively show an approximated relaxation time distribution $\rho(\theta_1)$ and $\rho(\theta_5)$ calculated from the relaxation time distribution $\rho(\theta_{ref})$ represented in FIG. 4b by multiplying by a Heaviside step function $H(\tau_c(\theta)-\tau)$, FIG. 4e respectively shows a reconstructed relaxation curve $s(t,\theta_1)$ and $s(t,\theta_5)$ relating to the relaxation time distributions $\rho(\theta_1)$ and $\rho(\theta_5)$ represented in FIGS. 4c,d.

DETAILED DESCRIPTION

Figure 1:
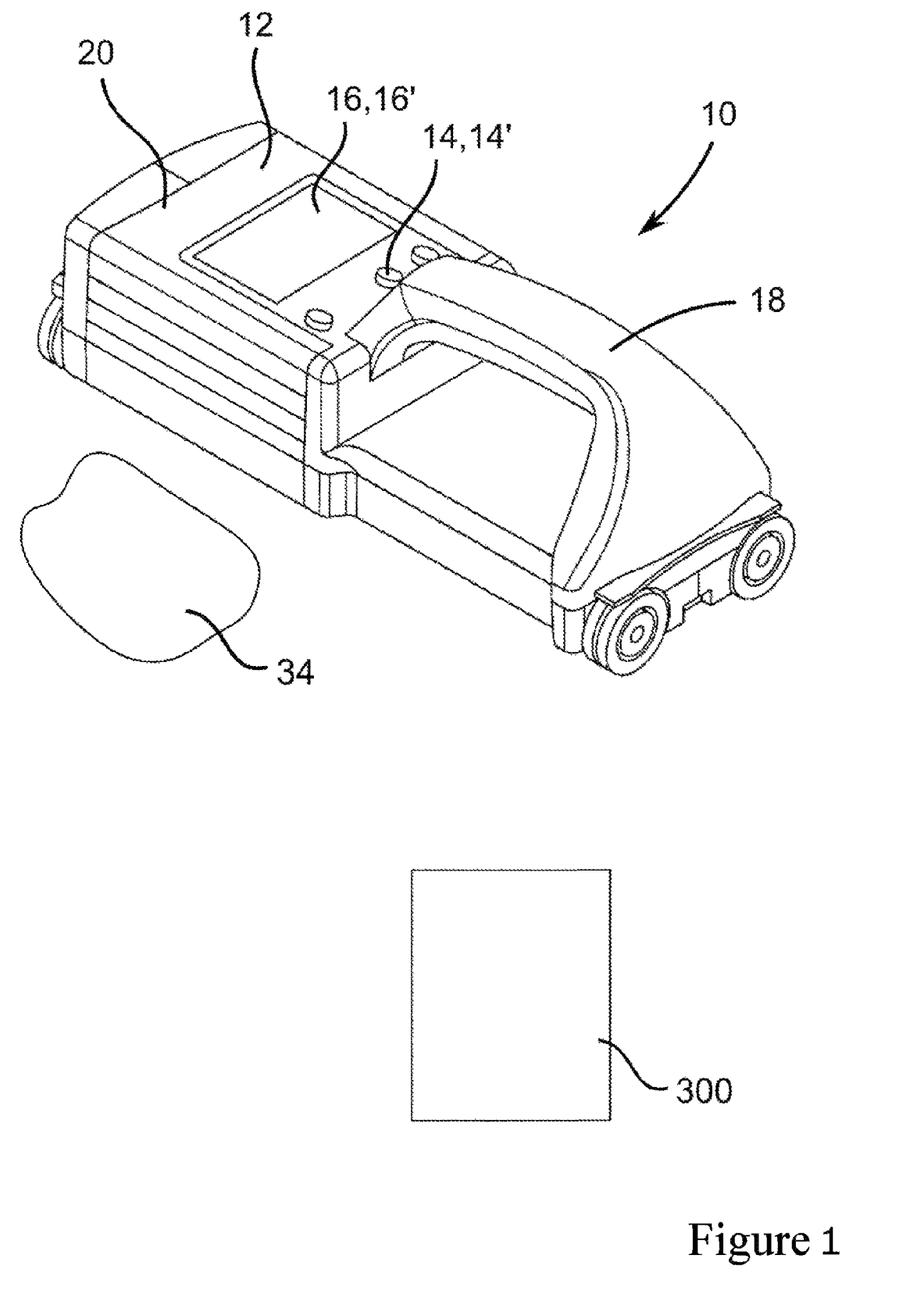
FIG. 1 shows a perspective representation of one configuration of the mobile NMR measuring device according to the disclosure.
Figure 2:
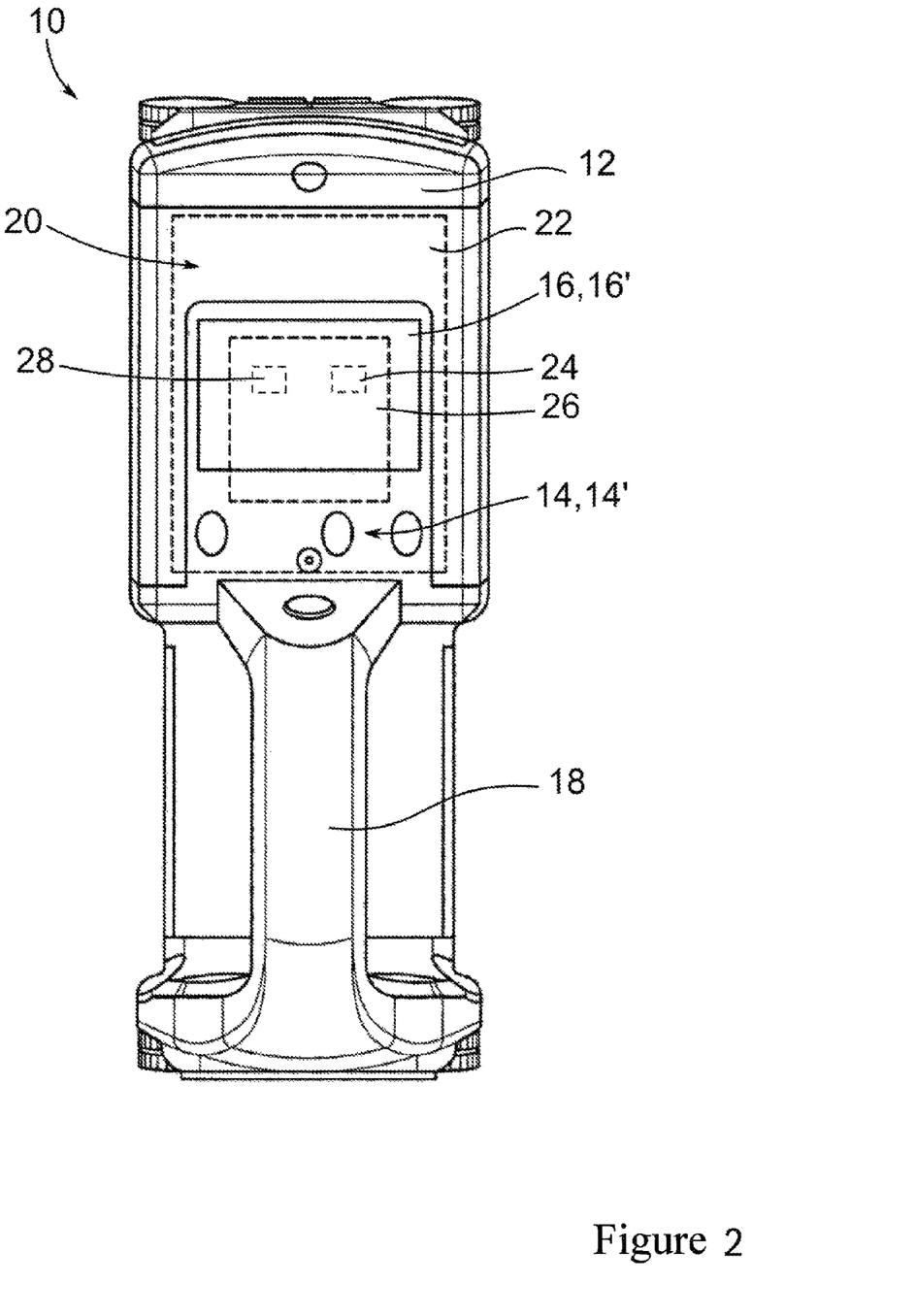
FIG. 2 shows a plan view of a first housing side of one configuration of the NMR measuring device according to the disclosure.

FIG. 1 and FIG. 2 show two views of an exemplary embodiment of the handheld energy-autonomous NMR measuring device 10 according to the disclosure, in a perspective representation and in a simplified schematic plan view, respectively.

The NMR measuring device 10 explained by way of example comprises a housing 12. Accommodated in the housing 12, there is an input apparatus 14 in the form of actuation elements 14', suitable for turning the NMR measuring device 10 on and off, for starting and configuring a measurement process and for input of working parameters. An output apparatus 16 for output of information which has been determined and for output of working parameters is furthermore provided in the form of a display screen 16' in the housing 12. The NMR measuring device 10 has a handle 18 for transport and for guiding it. The handle 18, the actuation elements 14' and the display screen 16' are located on a first housing side 20 (also "front side") of the NMR measuring device 10, which typically faces toward the user during operation of the NMR measuring device.

For the energy supply of the NMR measuring device 10, the NMR measuring device 10 comprises, on the second housing side (not represented in detail here) opposite the first housing side 20 on the rear side of the device, a recess which is used to receive energy storage units (not represented in detail here) independent of an electrical supply network in the form of rechargeable accumulators. Because of the energy storage unit independent of an electrical supply network, the NMR measuring device 10 can at least temporarily be operated energy-autonomously, i.e. independently of an electrical supply network, and therefore in particular without a cable. The NMR measuring device 10 presented by way of example has lithium-ion accumulators, the high energy density and power density of which are advantageously suitable for the energy supply of the NMR measuring device 10. Preferably, the energy supply apparatus comprises a releasable form-fit and/or force-fit connection interface, so that the energy storage unit (in general also a plurality of these) can be arranged removably and replaceably. Furthermore, the energy storage unit may be supplied with energy from an electrical supply network and charged in and/or outside the NMR measuring device 10.

On a support element 22, in particular a system circuit board or printed circuit board, inside the housing 12, further component parts of the NMR measuring device 10 are accommodated, in particular an NMR sensor 24, a control apparatus 26 for controlling the NMR measuring device 10 and for evaluating NMR measurement signals delivered by the NMR sensor 24, as well as a data communication interface 28 connected to the control apparatus 26 (see in particular FIG. 2). The control apparatus 26 is intended to carry out the two proposed methods according to the disclosure, and to this end comprises a memory having an executable operating program stored therein. In particular, the control apparatus 26 is used to evaluate at least one NMR measurement signal delivered by the NMR sensor 24, in particular to evaluate and provide a relaxation curve $s(t,\theta_{ref})$ of a material 34, to determine a relaxation time distribution $\rho(\theta_{ref})$ from the relaxation curve $s(t,\theta_{ref})$ provided, to determine an approximated relaxation time distribution $\rho(\theta_i)$, in particular on the basis of and by using the relaxation time distribution $\rho(\theta_{ref})$ provided, to reconstruct a relaxation curve $s(t,\theta_i)$ from the approximated relaxation time distribution $\rho(\theta_i)$, to determine an expected NMR measurement variable A from a reconstructed relaxation curve $s(t,\theta_i)$, and to determine a calibration specification as a function $\theta(A)$ describing the humidity $\theta$ as a function of an NMR measurement variable A which can be determined (by means of the NMR measuring device 10).

In addition, the control apparatus 26 is used to evaluate at least one NMR measurement signal delivered by the NMR sensor 24, in particular to record an NMR measurement variable A of the material 34 to be analyzed, to provide a calibration specification as a function of a specified material 34, and to determine the absolute humidity $\theta$ by using the functional relationship specified in the calibration specification.

In one alternative exemplary embodiment, the control apparatus 26 may also be intended only to carry out one of the two methods proposed, i.e. either to carry out the method for determining a calibration specification or to carry out the method for determining an absolute humidity $\theta$ of a material 34 to be analyzed.

The control apparatus 26 has control electronics comprising means for communication with the other component parts of the NMR measuring device 10, for example means for controlling and regulating the NMR sensor 24, an evaluation apparatus independent of the control apparatus 26, a data communication interface 28, or the like. The control apparatus 26 comprises in particular a unit having a processor unit, having a memory unit and having an operating program stored in the memory unit. The control apparatus 26 is intended to adjust at least one operating functional parameter of the NMR measuring device 10 as a function of at least one input by a user, by an optionally provided evaluation apparatus and/or by the data communication interface 28.

The NMR sensor 24 is intended to excite a nuclear magnetic resonance in atomic nuclei of the material 34 to be analyzed. The NMR sensor 24 is intended in particular to measure an NMR measurement signal, in particular a relaxation curve $s(t,\theta_i)$.

Figure 3:
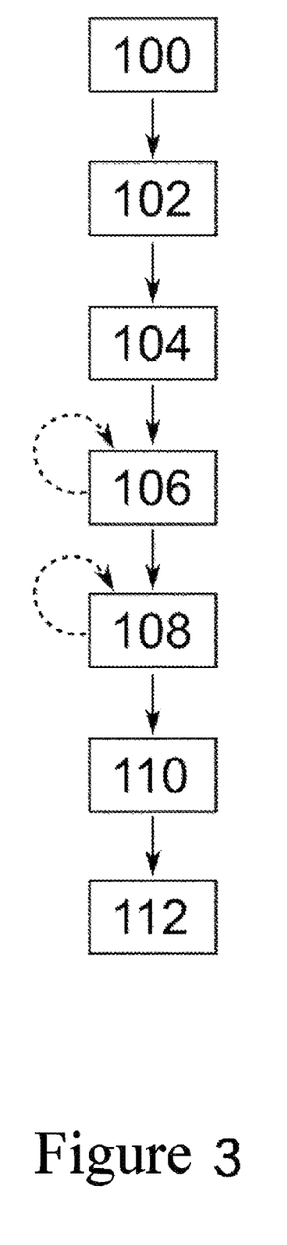
FIG. 3 shows a method flowchart of one embodiment of the method according to the disclosure for determining a calibration specification.

FIG. 3 shows a method flowchart which depicts an exemplary embodiment of the method according to the disclosure for determining an in particular material-specific calibration specification, the calibration specification specifying a functional relationship between an NMR measurement variable A, which can be determined using the NMR measuring device 10, of a material 34 to be analyzed and a humidity $\theta$ contained in the material 34 to be analyzed.

In method step 100, the material 34, for which a corresponding calibration specification is intended to be determined, is adjusted to a known humidity $\theta_{ref}$. This method step is, for example, carried out by using a drying cabinet.

In one exemplary embodiment, the humidity $\theta_{ref}$ may, for example, be 100% of the saturation humidity of the material 34.

In method step 102, an NMR measurement signal is recorded, in particular with an NMR sensor 24 of an NMR measuring device 10, and a relaxation curve $s(t,\theta_{ref})$ is determined therefrom. This relaxation curve $s(t,\theta_{ref})$ is subsequently provided to a computation unit of the device carrying out the method, in particular to the control apparatus 26 of the NMR measuring device 10. The NMR measurement signal, in particular the data on which it is based, may furthermore be preprocessed for evaluation, for example by smoothing, filtering, or the like. An exemplary relaxation curve $s(t,\theta_{ref})$ is represented in FIG. 4a.

In method step 104, a relaxation time distribution $\rho(\theta_{ref})$ is determined, in particular calculated, by inverse Laplace transformation from the relaxation curve $s(t,\theta_{re}d$ provided. A relaxation time distribution $\rho(\theta_{ref})$ calculated for the relaxation curve $s(t,\theta_{ref})$ represented in FIG. 4a is represented in FIG. 4b.

In method step 106, an approximated relaxation time distribution $\rho(\theta_i)$ relating to at least one humidity $\theta_i$, with $\theta_i < \theta_{ref}$, is calculated by multiplying the relaxation time distribution $\rho(\theta_{ref})$ by a Heaviside step function $H(\tau_c(\theta)-\tau)$, where $\tau_c(\theta)$ is selected in such a way that an integral $$s(\theta_i) = \int \rho(\tau,\theta_i) d\tau$$

is less by a fraction $1-\theta_i/\theta_{ref}$ than the same integral for the humidity $\theta_{ref}$, i.e. than $$s(\theta_{ref}) = \int \rho(\tau,\theta_{ref}) d\tau.$$

Figure 4:
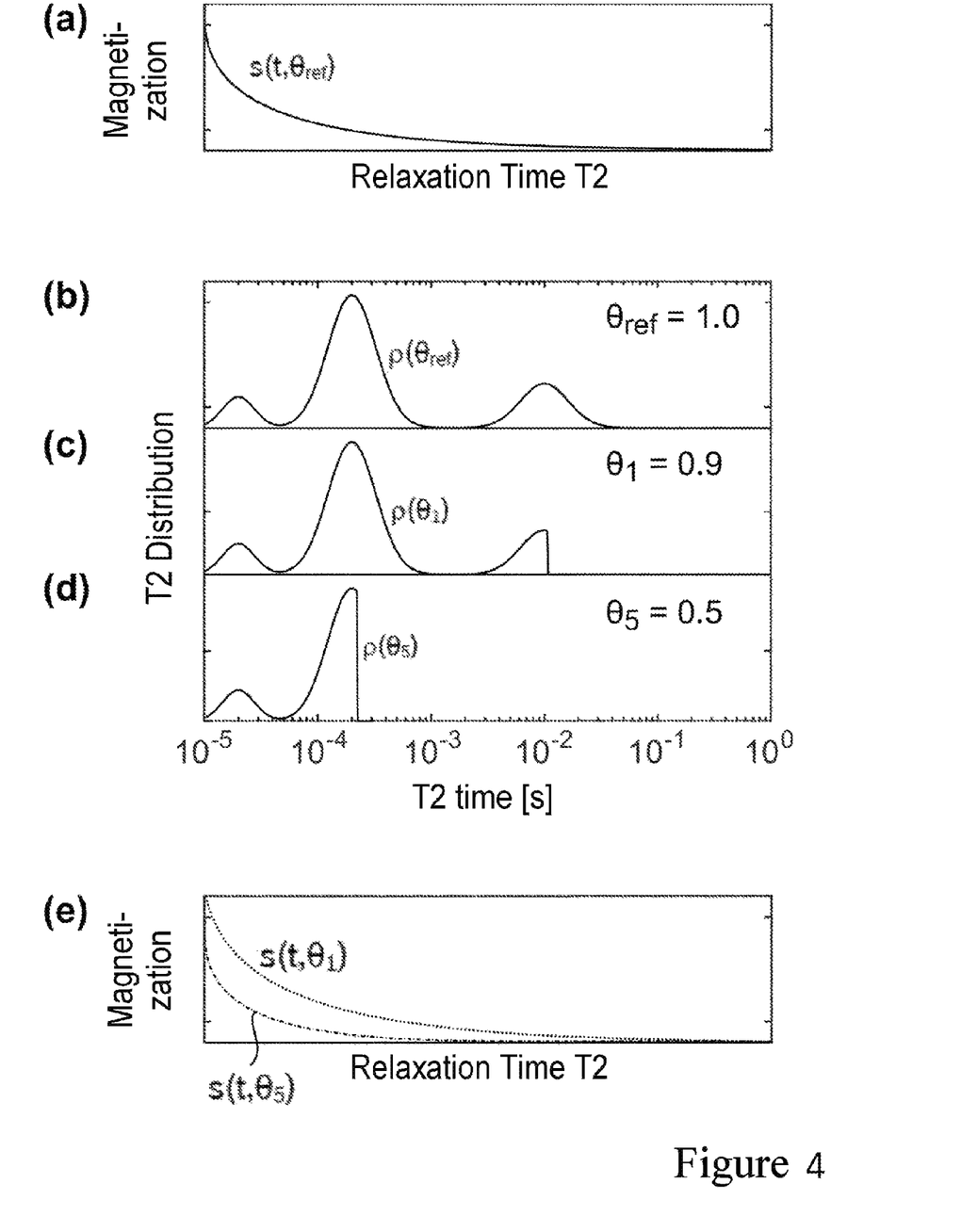

In one embodiment of the method, this method step 106 may be repeated several times—indicated by a dashed repetition arrow in the method flowchart in FIG. 4—so that after full completion of method step 106 approximated relaxation time distributions $\rho(\theta_i)$ relating to a multiplicity i of humidities $\theta_i$, with $\theta_i < \theta_{ref}$, have been calculated. In one exemplary embodiment, i is for example 9, i.e. including the relaxation time distribution $\rho(\theta_{ref})$ calculated from the relaxation curve $s(t,\theta_{ref})$ provided, there are in total 10 relaxation time distributions $\rho(\theta_{ref}), \rho(\theta_1), \ldots, \rho(\theta_9)$. FIGS. 4c and 4d respectively represent an exemplary approximated relaxation time distributions $\rho(\theta_1)$ and $\rho(\theta_5)$ calculated from the calculated relaxation time distribution $\rho(\theta_{ref})$ in FIG. 4b by multiplying by a Heaviside step function $H(\tau_c(\theta)-\tau)$. In this case, $\theta_1=0.9$ (corresponding to 90% of the saturation humidity of the material 34) and $\theta_5=0.5$ (corresponding to 50% of the saturation humidity of the material 34), so that $\tau_c(\theta_1)$ and $\tau_c(\theta_5)$ are correspondingly selected in such a way that the integral $$s(\theta) = \int \rho(\tau,\theta) d\tau$$

is less by a fraction 0.1 or 0.5, respectively, than $$s(\theta_{ref}) = \int \rho(\tau,\theta_{ref}) d\tau.$$

In the graphs represented, the reduction of the integral corresponds to a reduction of the area under the relaxation time distribution by the corresponding fraction 0.1 (by 10%) and 0.5 (by 50%), respectively.

In method step 108, a relaxation curve $s(t,\theta_i)$ is reconstructed from the respective approximated relaxation time distribution $\rho(\theta_i)$, so that this method step 108 is also repeated several times—indicated by a dashed repetition arrow in the method flowchart in FIG. 4. For the two exemplary humidities $\theta_1$ and $\theta_5$, two exemplary relaxation curves $s(t,\theta_1)$ and $s(t,\theta_5)$ are represented in FIG. 4e. From the relaxation curves $s(t,\theta_i)$ obtained in this way, here in the example of FIG. 4 $s(t,\theta_1)$ and $s(t,\theta_5)$, expected NMR measurement variables $A_i$ are subsequently determined in method step 110, i.e. here in the example $A_1$ and $A_5$, respectively. The NMR measurement variable $A_i$ is defined in this exemplary embodiment as an amplitude $s(0,\theta_i)$ of the respective relaxation curve $s(t,\theta_i)$. As an alternative or in addition, the relaxation curve $s(t,\theta_i)$ may itself already be interpreted and used as an NMR measurement variable A.

In method step 112, by using the expected NMR measurement variables $A_i$ which have been determined, the NMR measurement variable $A_{ref}$ relating to the humidity $\theta_{ref}$, and the corresponding humidities $\theta_i$ and $\theta_{ref}$, the calibration specification is determined as a function $\theta(A)$ describing the humidity $\theta$ as a function of the NMR measurement variable A which can be determined. In the exemplary embodiment of FIG. 4, the 10 humidities $\theta_1, \ldots, \theta_9$, $\theta_{ref}$ are stored in an allocation table or in a calibration curve as a calibration specification as a function of the NMR measurement variables $A_1, \ldots, A_9$ and $A_{ref}$. In the application, i.e. when carrying out the method for determining an absolute humidity $\theta$ of a material 34 to be analyzed, by using an NMR measuring device 10, an NMR measurement variable A evaluated from an NMR measurement may therefore be used to determine the humidity $\theta$ by reading, interpolating or calculating the value of the associated humidity $\theta$ by using the calibration specification.

In principle, the method according to the disclosure for determining an in particular material-specific calibration specification may be carried out for different materials 34, and in this way a material database which contains a multiplicity of material-specific calibration specification may be compiled.

Figure 5:
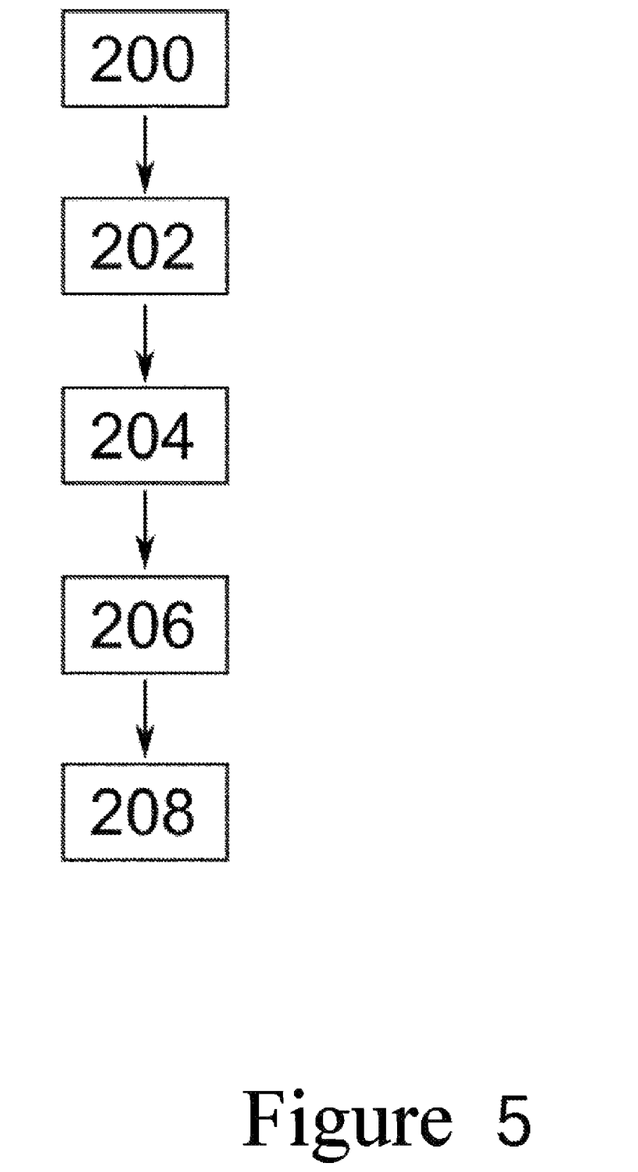
FIG. 5 shows a method flowchart of one embodiment of the method according to the disclosure for determining an absolute humidity of a material to be analyzed.

FIG. 5 shows a method flowchart which depicts an exemplary embodiment of the method according to the disclosure for determining an absolute humidity $\theta$ of a material 34 to be analyzed, by using an NMR measuring device 10.

In a method step 200, a material to be analyzed is initially specified by using an input apparatus 14 of the NMR measuring device 10 used, for example as a result of an input or selection by a user. In one exemplary embodiment, the user explicitly indicates the material 34 to be analyzed, for example by their selecting the name of the material "concrete screed" (for example from a predetermined list).

In method step 202—on the basis of the specified name of the material 34—a calibration specification is provided, as a function of the specified material 34, in particular to the control apparatus 26 of the NMR measuring device 10. The calibration specification relating to the material 34 to be analyzed is provided in this exemplary embodiment by a database query, in particular by using an Internet connection. The calibration specification called up from a database 300 (cf. FIG. 1) by means of the data communication interface 28 of the NMR measuring device 10 is forwarded to the control apparatus 26.

In method step 204, an NMR measurement variable A of the material 34 to be analyzed is recorded by means of the NMR measuring device 10. In particular, in this case an NMR measurement signal is recorded by the NMR sensor 24 of the NMR measuring device 10, and a relaxation curve $s(t,\theta)$ is determined therefrom. This relaxation curve $s(t,\theta)$ is subsequently provided to the control apparatus of the NMR measuring device 10, and the NMR measurement variable A required for identifying an allocation in the calibration specification is determined therefrom, in analogy with the description of the method in FIG. 4, here defined as an amplitude $s(0,\theta)$.

In method step 206, the absolute humidity $\theta$ is subsequently determined by using the functional relationship, specified in the calibration specification, between the NMR measurement variable A of the material 34 analyzed and the humidity $\theta$ expected in the material 34 analyzed.

In method step 208, the results of the quantification of the absolute humidity $\theta$ is processed further by means of the control apparatus 26 of the NMR measuring device 10, in particular output by means of the output apparatus 16 of the NMR measuring device 10 to a user of the NMR measuring device 10. In this embodiment, a percentage, which indicates the concentration of the absolute humidity $\theta$ in the material, is output.

The invention claimed is:

1. A method for determining a calibration specification for use with an NMR measuring device, the calibration specification specifying a functional relationship between an NMR measurement variable, which is determined using the NMR measuring device, of a material to be analyzed and a humidity contained in the material to be analyzed, the method comprising:
   identifying a relaxation curve of the material, the material having a known humidity;
   determining a relaxation time distribution from the identified relaxation curve of the material;
   determining an approximated relaxation time distribution relating to at least one other humidity, the at least one other humidity less than the known humidity;
   reconstructing another relaxation curve from the approximated relaxation time distribution;
   determining an expected NMR measurement variable from the reconstructed another relaxation curve for the at least one other humidity; and
   determining the calibration specification as a function describing the humidity contained in the material as a function of the NMR measurement variable.

2. The method as claimed in claim 1, wherein the identified relaxation curve of the material is a transverse relaxation curve.

3. The method as claimed in claim 1, wherein the known humidity is at least 50% of a saturation humidity of the material.

4. The method as claimed in claim 1, further comprising:
   determining the relaxation time distribution by inverse Laplace transformation from the identified relaxation curve of the material.

5. The method as claimed in claim 1, further comprising:
   calculating the approximated relaxation time distribution relating to the at least one other humidity by multiplying the determined relaxation time distribution by a Heaviside step function $H(\tau_c(\theta_i)-\tau)$,
   wherein $\tau_c(\theta_i)$ is selected such that an integral $s(\theta_1)=\int \rho (\tau,\theta_i)d\tau$ is less by a fraction $1-\theta_i/\theta_{ref}$ than $s(t,\theta_{ref})$,
   wherein $\tau$ is time,
   wherein $\theta_i$ is the at least one other humidity,
   wherein $\theta_{ref}$ is the known humidity,
   wherein $\rho(\theta_i)$ is the approximated relaxation time distribution, and
   wherein $s(t,\theta_{ref})$ is the identified relaxation curve of the material.

6. The method as claimed in claim 1, further comprising:
   calculating approximated relaxation time distributions relating to a multiplicity of humidities.

7. A method for determining an absolute humidity of a material to be analyzed, using an NMR measuring device, comprising:

specifying a material to be analyzed using an input apparatus of the NMR measuring device;
recording an NMR measurement variable of the specified material, using the NMR measuring device;
providing a calibration specification as a function of the specified material;
determining the absolute humidity using a functional relationship, specified in the calibration specification, between the recorded NMR measurement variable of the specified material and a humidity contained in the material analyzed,
wherein the calibration specification specifies the functional relationship between the NMR measurement variable and the humidity contained in the material to be analyzed,
wherein the calibration specification is determined by:
identifying a relaxation curve of the specified material, the specified material having a known humidity;
determining a relaxation time distribution from the identified relaxation curve of the specified material;
determining an approximated relaxation time distribution relating to at least one other humidity, the at least one other humidity less than the known humidity;
reconstructing another relaxation curve from the approximated relaxation time distribution;
determining an expected NMR measurement variable from the reconstructed another relaxation curve for the at least one other humidity and
determining the calibration specification as a function describing the humidity contained in the specified material as the function of the NMR measurement variable.

8. The method as claimed in claim 7, further comprising:
outputting the absolute humidity which has been determined for the specified material using an output apparatus of the NMR measuring device.

9. An NMR measuring device, comprising:
an NMR sensor; and
a control apparatus configured to control the NMR measuring device and to evaluate an NMR measurement variable from an NMR measurement signal recorded by the NMR sensor,
wherein the control apparatus is configured to determine a calibration specification for use with the NMR measuring device, the calibration specification specifying a functional relationship between the NMR measurement variable of a material to be analyzed and a humidity contained in the material to be analyzed, by (i) identifying a relaxation curve of the material, the material having a known humidity, (ii) determining a relaxation time distribution from the identified relaxation curve of the material, (iii) determining an approximated relaxation time distribution relating to at least one other humidity, the at least one other humidity less than the known humidity, (iv) reconstructing another relaxation curve from the approximated relaxation time distribution; (v) determining an expected NMR measurement variable from the reconstructed another relaxation curve for the at least one other humidity, and (vi) determining the calibration specification as a function describing the humidity contained in the material as a function of the NMR measurement variable.

* * * * *

UNITED STATES PATENT AND TRADEMARK OFFICE
CERTIFICATE OF CORRECTION

PATENT NO. : 11,187,665 B2
APPLICATION NO. : 16/759239
DATED : November 30, 2021
INVENTOR(S) : Edelmann It is certified that error appears in the above-identified patent and that said Letters Patent is hereby corrected as shown below:

In the Claims

In Claim 5, at Column 16, Lines 53-54: " $s(\theta_\perp) = \int \rho(\tau, \theta_i) d\tau$ " should read -- $s(\theta_i) = \int \rho(\tau, \theta_i) d\tau$ --.

Signed and Sealed this
Twenty-sixth Day of April, 2022

Katherine Kelly Vidal
Director of the United States Patent and Trademark Office